United States Patent [19]
Krafft

[11] Patent Number: 5,381,605
[45] Date of Patent: Jan. 17, 1995

[54] METHOD AND APPARATUS FOR DELIVERING GAS

[75] Inventor: Terry Krafft, Longmont, Colo.

[73] Assignee: Photonics Research Incorporated, Broomfield, Colo.

[21] Appl. No.: 2,444

[22] Filed: Jan. 8, 1993

[51] Int. Cl.$^6$ ............................................. F26B 3/08
[52] U.S. Cl. .......................................... 34/408; 34/586; 427/248.1; 427/250; 118/715
[58] Field of Search ............ 427/248.1, 249, 250, 427/252, 253; 34/10, 22, 586, 408; 585/801; 118/715

[56] References Cited

U.S. PATENT DOCUMENTS 4,916,828  4/1990  Yamane et al. ................... 34/10
5,019,423  5/1991  Hiai et al. ..................... 427/248.1

OTHER PUBLICATIONS

Gerrard, et al., "Commercial Dual Bubbler Solves TMI Transport Problem", *Air Products*, (1992).
Wilkie, James, "The Epitaxial Solution", *III-Vs*, 5:(1) 44–45 (1992).
Nishikawa, et al., "MOCVD Growth of InGaAlP Using Ethyldimethylindium As An In Source And Application To Visible-Region Lasers", *Journal of Crystal Growth*, 104:245–249 (1990).
Tsang, W. T., "From Chemical Vapor Epitaxy to Chemical Beam Epitaxy", *Journal of Crystal Growth*, 95:121–131 (1989).
York, et al., "Ethyldimethylindium For The Growth Of InGaAs–GaAs Strained–Layer Lasers By Metalorganic Chemical Vapor Deposition", *App. Phys. Lett.*, 55(24):2476–2478 (1989).
Knauf, et al., "Comparison of Ethyldimethylindium (EDMIn) And Trimethylindium (TMIn) For GaInAs And InP Growth By LP–MOVPE", *Journal of Crystal Growth*, 93:34–40(1988).

*Primary Examiner*—Henry A. Bennett
*Attorney, Agent, or Firm*—Fisher & Associates

[57] ABSTRACT

Method and apparatus for generating and delivering a gas that contains vapor produced by subliming a solid for use in chemical vapor deposition processes such as Metal Organic Molecular Beam Epitaxy (MOMBE) and Organometallic Vapor Phase Epitaxy (OMVPE). The method includes generating a gas saturated with the vapor and subsequently diluting the gas with an inert gas to obtain an uniform non-saturated gas. The apparatus includes a vessel for containing a sublimable solid, a heater for maintaining the vessel at a desired temperature, tubes and valves for introducing a gas into the vessel and for discharging a gas that is saturated with the vapor of the solid from the vessel, and a tube and a valve for diluting a gas discharged from the vessel.

12 Claims, 1 Drawing Sheet

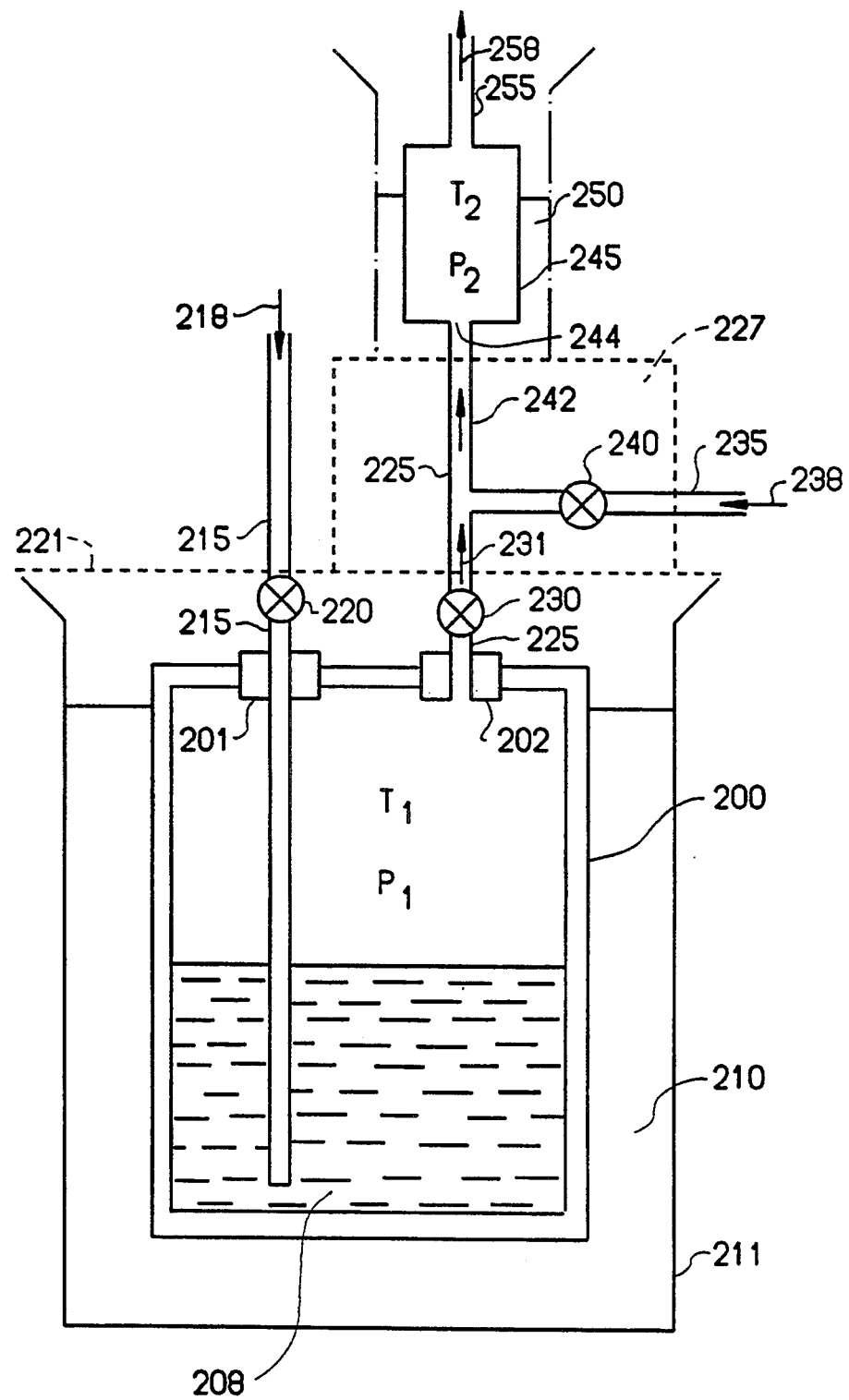

METHOD AND APPARATUS FOR DELIVERING GAS

FIELD OF THE INVENTION

This invention relates to a method and apparatus for delivering gas, and in particular, for generating and delivering gas that contains vapor produced by subliming a solid.

BACKGROUND OF THE INVENTION

Metal Organic Chemical Vapor Deposition (MOCVD) and Organometallic Vapor Phase Epitaxy (OMVPE) are widely used in forming semiconductor epitaxial layers on semiconductor substrates. In particular, they are utilized to grow epitaxial semiconductors containing compound semiconductors such as Gallium Arsenide (GaAs), Indium Gallium Arsenide (InGaAs), and Indium Phosphide (InP). These compound semiconductors have advantageous properties when compared to conventional silicon semiconductors and they are primarily used for semiconductor devices such as semiconductor lasers, high frequency microwave monolithic integrated circuits, and electro-optical devices.

In a typical MOCVD process, semiconductor substrates are first placed in a reaction chamber. The substrates are then heated under a hydrogen flow. Gases, including some containing vapors of metal organic compounds, are then introduced into the reaction chamber. As a result of chemical reaction at the surfaces of the heated substrates, thin layers of semiconductors are formed on the surfaces of the substrates. By continuously providing the gases and heating the substrates, the thicknesses of the semiconductor layers continuously increase. When the semiconductor layers reach desired thicknesses, the process is terminated by discontinuing supply of the reactant gases.

In the MOCVD process, the growth rate and the composition of the epitaxially grown layers depend on the delivery rates of the metal organic compounds. To form semiconductor epitaxial layers with desired composition and thickness, the delivery rate of each metal organic compound needs to be precisely controlled. Such precise control of the delivery rate is critical for fabricating semiconductor devices like semiconductor lasers which may contain epitaxial layers having thicknesses on the order of less than a hundred Angstroms.

Trimethylindium (TMI) is a widely used metal organic compound for providing the indium (In) used in forming epitaxial semiconductor layers such as Indium Gallium Arsenide (InGaAs). TMI is a solid metal organic compound at room temperature. Solid TMI sublimes (i.e., turns directly into vapor) at a rate proportional to its surface area and temperature. To introduce TMI into an MOCVD reaction chamber, TMI vapor is first generated by heating solid TMI. The vapor is then incorporated into a carrier gas and is subsequently delivered to the reaction chamber. The carrier gas is usually hydrogen ($H_2$) or an inert gas such as argon (Ar) or helium (He). The carrier gas functions as a vehicle that transports the vapor of a metal organic compound into the MOCVD reaction chamber.

High surface area TMI is usually employed in producing TMI vapor. However, during extended use, TMI recrystallizes and turns into large crystalline lumps thereby effectively reducing the surface area. As a result, even if other conditions remain unchanged during the process, the TMI delivery rate gradually decreases, thereby undesirably affecting the composition and growth rate of the epitaxially formed semiconductor layers.

Similar problems are encountered in Chemical Beam Epitaxy (CBE) or Metal Organic Molecular Beam Epitaxy (MOMBE) or any epitaxial technique in which the Group III source is supplied as a solid organometallic compound. The methodologies involved in these techniques are described by Stringfellow in *Organometallic Vapor Phase Epitaxy*, Academic Press, Inc., 1989, and by Tsang in "From Chemical Vapor Epitaxy to Chemical to Chemical Beam Epitaxy", *Journal of Crystal Growth*, 95(1989), pp.121-131. In addition, transport problems can be encountered in other chemical vapor deposition processes that use solid chemical sources such as deposition of aluminum from trimethylamine alane, deposition of copper from copper (II) hexafluoroacetylacetonate, or deposition of titanium nitride from tetrakis(dimethylamido) titanium (IV).

To overcome this problem, methods and apparatuses are disclosed in U.S. Pat. Nos. 4,916,828 and 5,019,423 to produce a stable delivery of solid metal organic compounds by saturating the carrier gas with metal organic vapor. When using this approach, the delivery rate for TMI remains stable over a long period of time. However, gas saturated with TMI vapor can easily condense in the tubing that leads the gas to the reaction chamber. Such condensation produces blockage in the tubing and alters the delivery rate of TMI.

It is therefore an object of this invention to generate and deliver at a stable rate a gas that contains a vapor produced by subliming a solid.

SUMMARY OF THE INVENTION

The present invention is a method and apparatus for generating and delivering a gas that contains a vapor produced by subliming a solid. The gas is not saturated with the vapor and therefore has minimum condensation during the delivery.

To generate and deliver such non-saturated gas at a stable rate, a gas saturated with vapor from the sublimable solid is first generated by heating a vessel that contains the solid to an elevated temperature and by introducing a first carrier gas into the vessel. The gas discharged from the vessel is thus saturated with the vapor. This saturated gas is subsequently diluted by a second carrier gas. The diluted gas is then delivered to a reaction chamber.

The apparatus of the present invention comprises a first vessel for containing the solid to be sublimed, means connected to an inlet-port of the first vessel for introducing a first carrier gas into the vessel, means for maintaining the first vessel at a first temperature so to generate therein a gas saturated with vapor by subliming the solid, discharging means attached to an outlet-port of the first vessel for discharging from the vessel a first output gas that is saturated with the vapor of the solid, and diluting means intercepting the discharging means for diluting the first output gas with a second carrier gas.

BRIEF DESCRIPTION OF THE DRAWING

These and other objects, features and advantages of the invention will be more readily apparent from the detailed description of FIG. 1 which schematically illustrates a preferred embodiment of the invention.

DETAILED DESCRIPTION

The present invention relates to a method and apparatus for generating and delivering a gas that contains vapor produced by subliming a solid. In particular, a method and apparatus are disclosed to generate and deliver, in a stable and controlled manner, a gas that contains a given amount of vapor from a sublimable solid.

To generate and deliver a gas containing a vapor from a sublimable solid at a stable rate and in a controllable manner, the sublimable solid is first placed in a suitable first vessel. A first carrier gas is then introduced to the first vessel through an input-port of the vessel and a first output gas containing the vapor of the sublimable solid is discharged through an output-port of the vessel. The first vessel is maintained at a temperature sufficiently high that the first output gas is saturated with the vapor of the sublimable solid.

Advantageously, the delivery rate of the vapor at the output-port of the first vessel depends only on the flow rate of the first carrier gas and the temperature of the vessel. Preferably, the flow rate of the first carrier gas is sufficiently low that the gas has a long residence time within the first vessel and becomes saturated with the vapor. The first output gas is then diluted by introducing a second carrier gas into the first output gas to produce a non-saturated second output gas. Preferably, the first output gas is diluted immediately after it is discharged from the first vessel, which minimizes any condensation of the vapor that might occur before the dilution.

The second output gas is then delivered to a reaction chamber. Note that the delivery rate of the sublimable compound in the second output gas depends only on the temperature of the first vessel and the flow rate of the first carrier gas. Therefore, at a given vessel temperature, the delivery rate of the vapor can be adjusted to a desired value by adjusting the flow rate of the first carrier gas. Since the second output gas is not saturated with the vapor, condensation of the vapor during the delivery of the second output gas is minimized as compared with delivering a vapor-saturated gas. Therefore, a stable delivery rate is achieved for a gas that contains vapor from a sublimable solid.

Preferably, prior to delivering the second output gas to the reaction chamber, the second output gas passes through a second vessel which is maintained at a uniform second temperature. This process makes the temperature of the second output gas more uniform.

The apparatus of the present invention comprises a first vessel for containing the sublimable solid. The first vessel has an input-port and an output-port. The apparatus further comprises means attached to the input-port for introducing a first carrier gas to the first vessel, means attached to the vessel for maintaining the vessel at a first temperature, discharging means attached to the output-port for discharging a first output gas from the vessel, and diluting means intercepting the discharging means for diluting the first output gas discharged from the vessel with a second carrier gas. Preferably, the diluting means is located near the output-port.

FIG. 1 depicts a preferred apparatus of this invention. The preferred apparatus comprises a first vessel 200 having an input-port 201 and an output-port 202, and a second vessel 245. Illustratively, a sublimable solid 208 such as TMI is placed in the first vessel. A tube 215 and a valve 220 form the means for introducing a first carrier gas 218 into the first vessel. A tube 225 and a valve 230 form means for discharging a gas 231 from the first vessel toward the second vessel. A tube 235 and a valve 240 form the diluting means for introducing a second carrier gas 238 into gas 231 to produce a gas 242 which is delivered to the second vessel. Additionally, the preferred apparatus further includes a first heater 210 for maintaining the first vessel at a first temperature; and a second heater 250 as means for maintaining the second vessel at a second temperature so to blend and heat gas 242 to obtain a gas 258.

As shown in FIG. 1, sublimable solid 208 such as TMI is placed at the lower portion of the first vessel. Tube 215 for introducing the first carrier gas extends below the surface of the sublimable solid. Alternatively, as disclosed in U.S. Pat. No. 5,019,423 which is incorporated herein by reference, the sublimable solid can be placed on a mesh in the middle section of the vessel with tube 215 entering the lower portion of the vessel below the mesh. In another alternative embodiment, the sublimable solid can be replaced by a mixture of the sublimable solid and a packing material; and such an embodiment for producing a gas saturated with vapor of the sublimable solid is disclosed in U.S. Pat. No. 4,916,828 which is also incorporated herein by reference.

Illustratively, both the input-port and output-port are located on top of the vessel. Tube 215 is inserted into the first vessel through input-port 201. The input-port is sealed around tube 215. Valve 220 is used to regulate the flow rate of the first carrier gas. Tube 225 is connected to output-port 202 for discharging gas 231. Tube 235 intercepts tube 225 for introducing second carrier gas 238 into gas 231 to produce gas 242. Valve 240 is used to control the flow rate of the second carrier gas.

Preferably, valve 230 is located close to output-port 202. Also, tubing 235 intercepts tube 225 at a location close to valve 230 to minimize any condensation of vapor from gas 231 prior to dilution.

One end of the tubing 225 is connected to the output-port of the first vessel and the other end of tubing 225 is connected to an input-port 244 of second vessel 245 for introducing gas 242 into the second vessel. A tube 255 is connected to an output-port of the second vessel to deliver a gas 258 into a reaction chamber.

Preferably, to further minimize condensation of the vapor, a region enclosed by a dashed line 221 and a solid line 211 is also maintained at the same temperature, $T_1$, as the first vessel. Since valves 220 and 230 are within this region, they are at the temperature $T_1$.

Illustratively, a dashed line enclosed region 227 is preferably maintained at a temperature between $T_1$, the temperature of the first vessel, and $T_2$, the temperature of the second vessel. This region includes portions of tubes 225 and 235, and valve 240. As the result, vapor condensation in tubes 225 and 235 is reduced.

When operating, first carrier gas 218 is first introduced into the first vessel. Preferably, the first vessel is maintained at an elevated temperature which is sufficient to saturate the input first carrier gas with vapor of the sublimable solid. Higher temperature results in higher vapor pressure. For example, TMI has a vapor pressure of 1.7 torr at 20° C. When it is heated to 45° C., the vapor pressure of TMI increases to 12 torr.

The temperature required to produce a gas saturated with vapor of the sublimable solid such as TMI depends on the flow rate of the first carrier gas. When the flow rate of the first carrier is increased, the temperature of the first vessel may be required to increase accordingly so that output gas 231 remains saturated with vapor. Such gas saturated with vapor has a stable concentration and is independent of the surface area of the sublimable solid the first vessel.

Gas 231 that is discharged from the output-port the vessel is saturated with vapor of the sublimable solid. Gas 231 is then diluted by second carrier gas 238 to produce non-saturated gas 242. The degree of dilution depends on the flow rate of the second carrier gas. The diluted gas passes through the heated second vessel to become a non-saturated uniform gas 258 to be delivered to the reaction chamber.

In this system, the delivery rate of the sublimable solid only depends on the flow rate of the first carrier and the temperature of the first vessel. Because it does not depend on the surface area of the solid, the final delivery rate is stable over a long period of time.

Since the final discharged gas 258 is not saturated with vapor, the condensation of vapor is minimized as compared with delivering a gas saturated with vapor.

Note that the pressure in the second vessel $P_2$ should be kept less than the pressure in the first vessel $P_1$ to prevent any reverse gas flow from the second to the first vessel. Such conditions can be achieved by properly adjusting the flow rates of the first and second carrier gas and the temperatures of the first and second vessels.

The above-described method and apparatus can be utilized in presently available epitaxial technologies such as MOCVD, OMVPE, CBE, and MOMBE wherein organometallic compounds are utilized as the sublimable solids. The method and apparatus can also be applied to other chemical vapor deposition processes, or processes that generate and deliver vapor produced by subliming a solid.

What is claimed is:

1. A method for generating and delivering gas containing vapor produced by subliming a solid comprising the steps of:
   introducing a first carrier gas into a first vessel containing the solid;
   heating the first vessel to a first temperature so that the gas in the vessel is substantially saturated with vapor produced by subliming the solid;
   discharging a first output gas from the first vessel, the first output gas being substantially saturated with the vapor; and
   introducing a second carrier gas into the first output gas to produce a second output gas, the second output gas being non-saturated with the vapor.

2. The method of claim 1 further comprising the step of introducing the second output gas into a second vessel which is maintained at a second temperature and discharging the second output gas to outside of the second vessel.

3. An apparatus for generating and delivering gas containing vapor produced by subliming a solid comprising:
   a vessel for containing the solid, the vessel having an input-port and an output-port;
   means for introducing a first carrier gas into the vessel through the input-port;
   means for maintaining the vessel at a first temperature so to generate therein a gas saturated with the vapor produced by subliming the solid;
   discharging means connected to the output-port for discharging from the vessel a first output gas saturated with the vapor; and
   diluting means intercepting the discharging means for introducing a second carrier gas Into the first output gas so to produce a second output gas not saturated with the vapor.

4. The apparatus of claim 3 further comprising a second vessel for heating the second output gas and means for maintaining the second vessel at a second temperature.

5. A method employed in organometallic vapor phase epitaxy for generating and delivering gas containing vapor produced by subliming an organometallic compound comprising the steps of:
   introducing a first carrier gas into a first vessel containing the compound;
   heating the first vessel to a first temperature so that the gas in the vessel is substantially saturated with vapor produced by subliming the compound;
   discharging a first output gas from the first vessel, the first output gas being substantially saturated with the vapor; and
   introducing a second carrier gas into the first output gas to produce a second output gas, the second output gas being non-saturated with the vapor.

6. The method of claim 5 further comprising the step of introducing the second output gas into a second vessel which is maintained at a second temperature and discharging the second output gas to outside of the second vessel.

7. A method employed in metal organic molecular beam epitaxy for generating and delivering gas containing vapor produced by subliming an organometallic compound comprising the steps of:
   introducing a first carrier gas into a first vessel containing the compound;
   heating the first vessel to a first temperature so that the gas in the vessel is substantially saturated with vapor produced by subliming the compound;
   discharging a first output gas from the first vessel, the first output gas being substantially saturated with the vapor; and
   introducing a second carrier gas into the first output gas to produce a second output gas, the second output gas being non-saturated with the vapor.

8. The method of claim 7 further comprising the step of introducing the second output gas into a second vessel which is maintained at a second temperature and discharging the second output gas to outside of the second vessel.

9. An apparatus employed in organometallic vapor phase epitaxy for generating and delivering gas containing vapor produced by subliming an organometallic compound comprising:
   a vessel for containing the compound, the vessel having an input-port and an output-port;
   means for introducing a first carrier gas into the vessel through the input-port;
   means for maintaining the vessel at a first temperature so to generate therein a gas saturated with the vapor produced by subliming the compound;
   discharging means connected to the output-port for discharging from the vessel a first output gas saturated with the vapor; and
   diluting means intercepting the discharging means for introducing a second carrier gas into the first output gas so to produce a second output gas not saturated with the vapor.

10. The apparatus of claim 9 further comprising a second vessel for heating the second output gas and means for maintaining the second vessel at a second temperature.

11. An apparatus employed in metal organic molecular beam epitaxy for generating and delivering gas containing vapor produced by subliming an organometallic compound comprising:

a vessel for containing the compound, the vessel having an input-port and an output-port;

means for introducing a first carrier gas into the vessel through the input-port;

means for maintaining the vessel at a first temperature so to generate therein a gas saturated with the vapor produced by subliming the compound;

discharging means connected to the output-port for discharging from the vessel a first output gas saturated with the vapor; and diluting means intercepting the discharging means for introducing a second carrier gas into the first output gas so to produce a second output gas not saturated with the vapor.

12. The apparatus of claim 11 further comprising a second vessel for heating the second output gas and means for maintaining the second vessel at a second temperature.

* * * * *